(12) United States Patent
Renkens et al.

(10) Patent No.: US 7,102,729 B2
(45) Date of Patent: Sep. 5, 2006

(54) LITHOGRAPHIC APPARATUS, MEASUREMENT SYSTEM, AND DEVICE MANUFACTURING METHOD

(75) Inventors: Michael Jozef Mathijs Renkens, Sittard (NL); Alexander Matthijs Struycken, Eindhoven (NL); Ruben Jan Kok, 's Hertogenbosch (NL); Martinus Cornells Maria Verhagen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 59 days.

(21) Appl. No.: 10/769,992

(22) Filed: Feb. 3, 2004

(65) Prior Publication Data
US 2005/0168714 A1 Aug. 4, 2005

(51) Int. Cl.
G03B 27/42 (2006.01)
G01B 11/00 (2006.01)

(52) U.S. Cl. ......................................... 355/53; 356/399

(58) Field of Classification Search ............... 356/4.08, 356/399, 614, 616; 355/53
See application file for complete search history.

(56) References Cited

U.S. PATENT DOCUMENTS 5,721,607 A * 2/1998 Ota ............................. 355/53
6,278,957 B1 * 8/2001 Yasuda et al. ............... 702/150
6,819,425 B1 * 11/2004 Kwan ........................ 356/399
6,850,333 B1 * 2/2005 Johnson et al. ............. 356/625
6,906,782 B1 * 6/2005 Nishi ........................... 355/53
2002/0041380 A1 * 4/2002 Kwan ........................ 356/616
2004/0027586 A1 * 2/2004 Ichikawa et al. ........... 356/614

* cited by examiner

Primary Examiner—Rodney Fuller
Assistant Examiner—Kevin Gutierrez
(74) Attorney, Agent, or Firm—Pillsbury Winthrop Shaw Pittman LLP

(57) ABSTRACT

The invention pertains to a measurement system for measuring displacement of a moveable object relative to a base in at least a first direction of measurement, the moveable object having at least one reference part that is moveable in a plane of movement relative to the base, the actual movements of the reference part being within an area of said plane of movement that is bounded by a closed contour having a shape. The measurement system comprises a sensor head that operatively communicates with a planar element. The sensor head is mounted onto the base and the planar element being mounted onto the reference part of the moveable object or the other way around, wherein the planar element has a shape that is essentially identical to the shape of the closed contour.

10 Claims, 8 Drawing Sheets

LITHOGRAPHIC APPARATUS, MEASUREMENT SYSTEM, AND DEVICE MANUFACTURING METHOD

BACKGROUND OF THE INVENTION

1. Field of the Invention

The present invention relates to a lithographic apparatus, device manufacturing method, and a measurement system.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Known lithographic apparatus comprise moveable components and objects, such as a substrate holder or table, which holds the substrate during exposure or a reticle stage. In many cases, the displacements of such moveable objects relative to a base have to be measured. Conventionally, interferometers and/or capacitive sensors are used for monitoring the displacement of the movable objects. Both systems have their disadvantages.

Interferometers are used for their accuracy, but are very expensive equipment. They also require the presence of high quality mirrors that have to be arranged very accurately onto the moveable object. The mirrors also have to be arranged under various angles, which makes the moveable object even more complex to produce. Also, interferometers require an extreme stable measurement environment with regard to composition, temperature, pressure, and turbulence.

Capacitive sensors, on the other hand, have a small range over which they can used, and their accuracy is not always sufficient. Moreover, they require a small distance between the sensor and the object to which the distance has to be measured.

SUMMARY OF THE INVENTION

Principles of the present invention, as embodied and broadly described herein, provide a lithographic apparatus that is provided with a cost-effective measurement system for accurately measuring displacement of a moveable object relative to a base, which is less sensitive to environmental conditions. In one embodiment, the lithographic apparatus comprises an illumination system for providing a beam of radiation, a support structure for supporting a patterning device that imparts the beam of radiation with a pattern in its cross-section, a substrate holder for holding a substrate having a target portion, a projection system for projecting the patterned beam onto the target portion of the substrate and a moveable object having at least one reference part, which is moveable in a plane of movement relative to a base, the actual movements of the reference part being within an area of said plane of movement, the area being bound by a closed contour having a shape. The embodiment further comprises a measurement system for measuring the displacement of the moveable object relative to a base in at least a first direction of measurement, the measurement system including a sensor head and a planar element associated with said sensor head, the sensor head being mounted onto the base and the planar element being mounted onto the reference part of the moveable object or the planar element being mounted onto the base and the sensor head being mounted onto the reference part of the moveable object, wherein the planar element has a shape that is essentially identical to the shape of the closed contour.

By giving the planar element the same shape as the shape of the closed contour, the face of the planar element cooperating with the sensor head is used efficiently as no parts of the planar element remain unused.

In a preferred embodiment, the first direction of measurement lies within a plane that is at least substantially parallel to the plane of movement. In that case, preferably the sensor head is an encoder head and the planar element is a ruler, which ruler comprises a grating. By using an encoder system comprising an encoder head and a grating, an accuracy comparable to the accuracy of an interferometer can be achieved, without having the disadvantages of an interferometer.

Alternatively, the first direction of measurement can be at least substantially perpendicular to the plane of movement. In that case, the sensor head can be an interferometer and with a mirror as a planar element. As an alternative for the interferometer, the sensor head can be a capacitive sensor in which case the planar element is an electrically conductive element.

In an embodiment in which the first direction of measurement lies within a plane that is at least substantially parallel to the plane of movement, and the moveable object comprises two or more reference parts that are located at known relative positions. The measurement system is adapted for measuring displacement of at least two reference parts relative to the base in a first direction, and for measuring displacement of at least one reference part relative to the base in a second direction. The first and the second direction are different. This way, based on the measurements, translational displacements of the reference parts relative to the base in the first direction, the second direction as well as rotational displacement of the reference parts relative to the base around an axis perpendicular to the plane defined by the first and the second direction of measurement can be determined.

It is envisaged that the moveable object is a reticle stage or a substrate table/holder for holding a substrate. When the moveable object is a substrate table, the closed contour preferably has the same shape as the substrate.

According to another embodiment, there is provided a measurement system for measuring displacement of a moveable object relative to a base in at least a first direction of measurement, the moveable object having at least one reference part which is moveable in a plane of movement relative to the base, the actual movements of the reference part being within an area of the plane of movement, the area being bound by a closed contour having a shape. The measurement system comprising a sensor head and a planar element associated with the sensor head, the sensor head being mounted onto the base and the planar element being mounted onto the reference part of the moveable object or the planar element being mounted onto the base and the sensor head being mounted onto the reference part of the moveable object, wherein the planar element has a shape that is essentially identical to the shape of the closed contour.

According to another embodiment of the invention, there is provided a device manufacturing method comprising providing a substrate having a target portion, providing a beam of radiation using an illumination system, using a patterning device to impart the projection beam with a pattern in its cross-section, projecting the patterned beam of radiation onto the target portion of the substrate, and providing a moveable object having at least one reference part, which is moveable in a plane of movement relative to the base, the actual movements of the reference part being within an area of said plane of movement, the area being bound by a closed contour having a shape. The embodiment further comprises measuring displacement of the moveable object relative to a base in at least a first direction of measurement, using a measurement system, the measurement system comprising a sensor head and a planar element associated with said sensor head, the sensor head being mounted onto the base and the planar element being mounted onto the reference part of the moveable object or the planar element being mounted onto the base and the sensor head being mounted onto the reference part of the moveable object; wherein the planar element has a shape that is essentially identical to the shape of the closed contour.

According to another embodiment of the invention, there is provided a lithographic apparatus comprising: an illumination system for providing a beam of radiation; a support structure for supporting a patterning device that imparts the beam with a pattern in its cross-section, a substrate holder for holding a substrate having a target portion, a projection system for projecting the patterned beam onto a target portion of a substrate, a movable object, which is moveable relative to a base, and a measurement system for measuring displacement of the moveable object relative to the base in six degrees of freedom. The embodiment further comprises at least three primary measurement units for measuring translational displacement of the moveable object relative to the base in a first direction, at least two secondary measurement units for measuring translational displacement of the moveable object relative to the base in a second direction differing from the first direction, at least one tertiary measurement unit for measuring translational displacement of the moveable object relative to the base in a third direction differing from the first direction and from the second direction and extending at an angle relative to a directional plane, which directional plane is defined by a combination of the first direction and the second direction. Each measurement unit comprising a sensor head and a planar element in which the sensor head is adapted to send a beam to the planar element and the planar element is adapted to reflect the beam to the sensor head for measuring translational displacement of the sensor head relative to the planar element. The measurement units being located at known relative positions, wherein the measurement units are combined into at least three measurement assemblies, each of these three measurement assemblies comprising a primary measurement unit and either a secondary measurement unit or a third measurement unit, the directions associated with the measurement units of a single measurement assembly together defining a measurement plane, each of the planar elements of a single measurement assembly being arranged parallel to said measurement plane.

In the measurement system of the lithographic apparatus according to the second aspect of the invention, capacitive sensors or interferometers are no longer used.

Preferably, the first direction is substantially perpendicular to the second direction, and the third direction is substantially perpendicular to the plane defined by the first direction and the second direction. This significantly reduces the complexity of the algorithm that the measurement system has to process raw measurement data in order to obtain the displacements of the movable object.

Preferably, at least one measurement unit is an encoder unit, the associated sensor head being an encoder head and the associated planar element being a grating. Encoder systems are a good alternative for interferometers and/or capacitive sensors, as they reduced the disadvantages of interferometers and capacitive sensors significantly. More preferably, encoders systems are used for determining displacement of the moveable object in all six degrees of freedom.

Preferably, the planar elements of a measurement assembly are combined into a two-dimensional grating. This reduces the number of planar elements required. It is envisaged that the two-dimensional grating comprises two different groups of lines, each group comprising a plurality of mutually parallel lines, while the lines from different groups extend in different directions. Preferably, the lines of different groups intersect each other under an angle of substantially 90°. Alternatively, the two-dimensional grating is provided with a checkerboard pattern. The transitions between the relatively dark areas and the relatively light areas have the same effect as the lines of the grating described before.

The pitch between the lines of the grating may vary over the grating. In case of a checkerboard pattern, the size and shape of the light and dark areas may vary. In order to reduce the measurement error due to such variations, the measurement system preferably comprises means for determining the average pitch between a plurality of lines or transitions between light and dark of the grating.

As an alternative or in addition to this provision, the lines or areas of the grating may be mapped by means of calibration before use. The map of the lines or the areas is subsequently stored in the measurement system.

In lithographic apparatus, it can occur that the displacement of the moveable object in a first translational degree of freedom is significantly larger than displacements of that moveable object in the other translational degrees of freedom. In that case, preferably the direction of measurement associated with the primary measurement units is substantially equal to the direction of the first translational degree of freedom. This increases the accuracy of the measurements.

It is envisaged to combine the first embodiment of the invention and the second embodiment of the invention. In that case, the moveable object has at least one reference part. The reference part is moveable in a plane of movement relative to the base. The actual movements of the reference part are within an area of said plane of movement, and the area is bound by a closed contour having a shape. At least one planar element of at least one measurement assembly having a measurement plane that is substantially parallel to the plane of movement has a shape that is essentially identical to the shape of the contour. This embodiment combines the advantages of the first and the second aspect of the invention.

It is envisaged that the movable object may be a reticle stage or a short stroke unit of a reticle stage, and the base is a long stroke unit of said reticle stage.

It is further envisaged that, in the case of the combination of the first and the second embodiments of the invention, the moveable object is a substrate holder for holding a substrate.

Preferably, at least one sensor head is mounted onto the base, and the planar element associated with said sensor head is mounted onto the moveable object. More preferably, all sensor heads are is mounted onto the base, and all planar elements associated with the sensor heads are mounted onto the moveable object.

Alternatively, at least one planar element is mounted onto the base, and the sensor head associated with said planar element is mounted onto the moveable object.

Also according to yet another embodiment of the invention, there is provided a measurement system for measuring displacement of a moveable object relative to a base in six degrees of freedom, the measurement system comprising at least three primary measurement units for measuring translational displacement of the moveable object relative to the base in a first direction, at least two secondary measurement units for measuring translational displacement of the moveable object relative to the base in a second direction differing from the first direction, at least one tertiary measurement unit for measuring translational displacement of the moveable object relative to the base in a third direction differing from the first direction and from the second direction and extending at an angle relative to a directional plane, which directional plane is defined by a combination of the first direction and the second direction. Each measurement unit comprises a sensor head and a planar element in which the sensor head is adapted to send a beam to the planar element and the planar element is adapted to reflect the beam to the sensor head for measuring translational displacement of the sensor head relative to the planar element. The measurement units are located at known relative positions, wherein the measurement units are combined into at least three measurement assemblies, each of these three measurement assemblies comprising a primary measurement unit and either a secondary measurement unit or a third measurement unit, the directions associated with the measurement units of a single measurement assembly together defining a measurement plane, each of the planar elements of a single measurement assembly being arranged parallel to said measurement plane.

According to a further second aspect of the invention, there is provided a device manufacturing method comprising providing a substrate having a target portion, providing a beam of radiation using an illumination system, using a patterning device to impart the beam with a pattern in its cross-section, projecting the patterned beam of radiation onto the target portion of the substrate, providing a movable object, which is moveable relative to a base, and measuring displacement of the moveable object relative to the base in six degrees of freedom, using a measurement system. The measurement system comprises at least three primary measurement units for measuring translational displacement of the moveable object relative to the base in a first direction, at least two secondary measurement units for measuring translational displacement of the moveable object relative to the base in a second direction differing from the first direction, at least one tertiary measurement unit for measuring translational displacement of the moveable object relative to the base in a third direction differing from the first direction and from the second direction and extending at an angle relative to a directional plane, which directional plane is defined by a combination of the first direction and the second direction. Each measurement unit comprises a sensor head and a planar element in which the sensor head is adapted to send a beam to the planar element and the planar element is adapted to reflect the beam to the sensor head for measuring translational displacement of the sensor head relative to the planar element. The measurement units being located at known relative positions, wherein the measurement units are combined into at least three measurement assemblies, each of these three measurement assemblies comprising a primary measurement unit and either a secondary measurement unit or a third measurement unit, the directions associated with the measurement units of a single measurement assembly together defining a measurement plane, each of the planar elements of a single measurement assembly being arranged parallel to said measurement plane.

According to a third aspect of the invention, there is provided a lithographic apparatus comprising an illumination system for providing a beam of radiation, a support structure for supporting a patterning device that imparts the beam with a pattern in its cross-section, a substrate holder for holding a substrate that has a target portion, a projection system for projecting the patterned beam onto the target portion of a substrate, and a moveable object, which is moveable relative to a base and comprises a grating. The measurement system comprises an encoder head for measuring displacement of the moveable object relative to the base in a first translational direction of measurement in cooperation with the grating of the moveable object, wherein the grating is an integral part of the moveable object.

In known lithographic apparatus, the grating is usually arranged on a ruler. This ruler is then attached to the moveable object, for example by gluing or by means of screws. This introduces inaccuracies, due to errors in the relative positioning of the ruler and the moveable object, and due to deformation of the ruler as a result of the forces exerted on the ruler. In order to overcome these problems, the invention proposes to make the grating an integral part of the movable object.

Preferably, the lines or the areas of the grating are printed directly onto the moveable object. Instead of by printing, the lines or the areas of the grating can be applied to the movable object by means of vapor deposition. Alternatively, it is envisaged that the lines or the areas of the grating are etched into the moveable object.

It is envisaged that the moveable object is a reticle stage. In that case, the grating is preferably applied to the mirror block. It is also envisaged that the moveable object is a substrate table for holding a substrate.

According to yet another embodiment of the invention, there is provided a device manufacturing method comprising providing a substrate having a target portion, providing a beam of radiation using an illumination system, using a patterning device to impart the beam with a pattern in its cross-section, projecting the patterned beam of radiation onto the target portion of the substrate, providing a moveable object, which is moveable relative to a base, the moveable object comprising a grating, measuring displacement of the moveable object relative to the base in a first translational direction of measurement in cooperation with the grating of the moveable object, using a measurement system comprising an encoder head, wherein the grating is an integral part of the moveable object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquidcrystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Projection Apparatus

Figure 1:
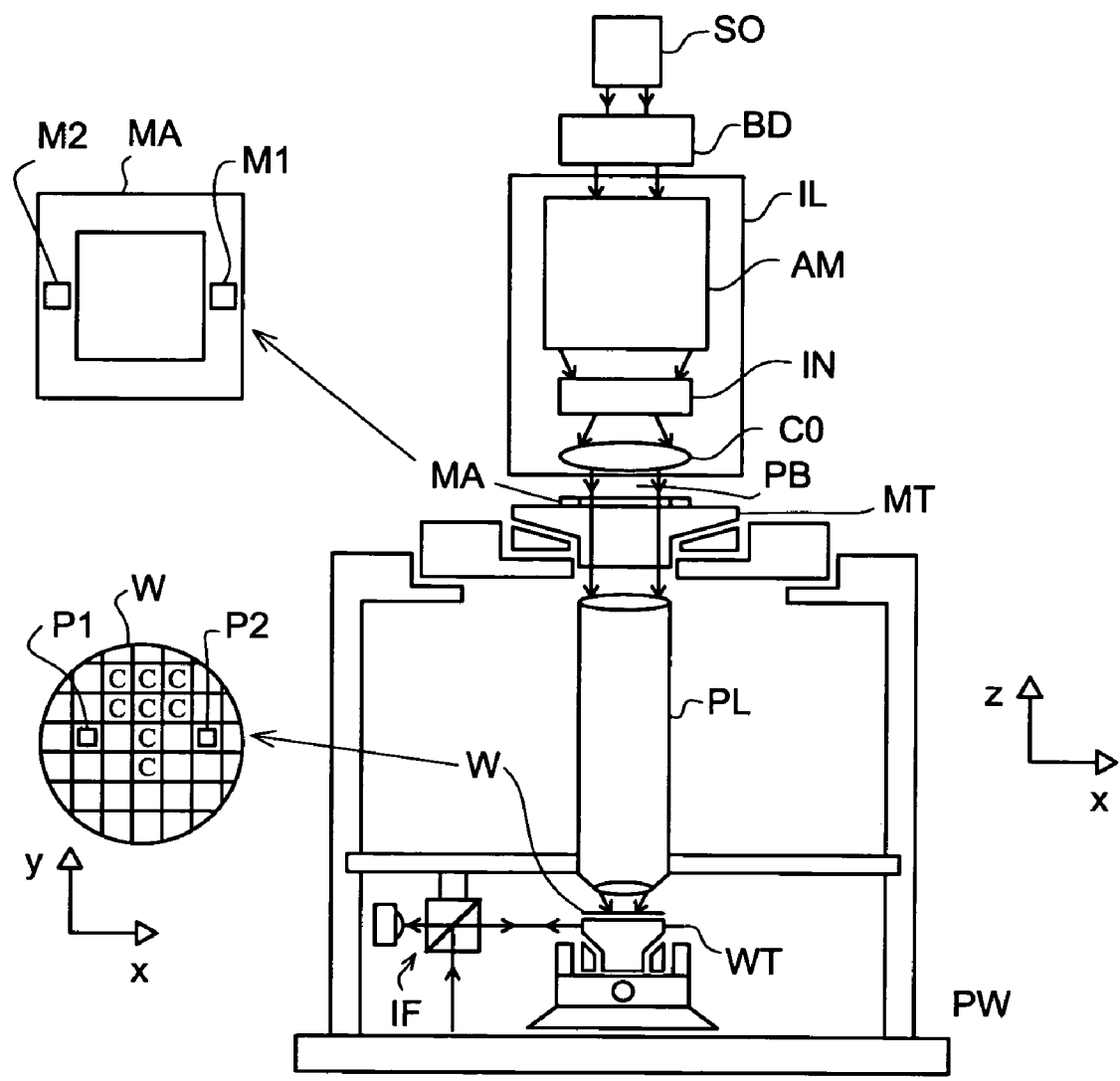
FIG. 1 depicts a lithographic apparatus according to an embodiment of the invention.

FIG. 1 schematically depicts a lithographic projection apparatus according to a particular embodiment of the invention. The apparatus comprises:

- an illumination system (illuminator) IL: for providing a projection beam PB of radiation (e.g. UV radiation, DUV radiation, or laser radiation);
- a first support structure (e.g. a mask table) MT: for supporting patterning device (e.g. a mask) MA and connected to first positioning device PM for accurately positioning the patterning device with respect to item PL;
- a substrate table or holder (e.g. a wafer table) WT: for holding a substrate (e.g. a resist-coated wafer) W and connected to second positioning device PW for accurately positioning the substrate with respect to item PL; and
- a projection system (e.g. a refractive projection lens) PL: for imaging a pattern imparted to the projection beam PB by patterning device MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution; and
other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

First Embodiment

Figure 2:
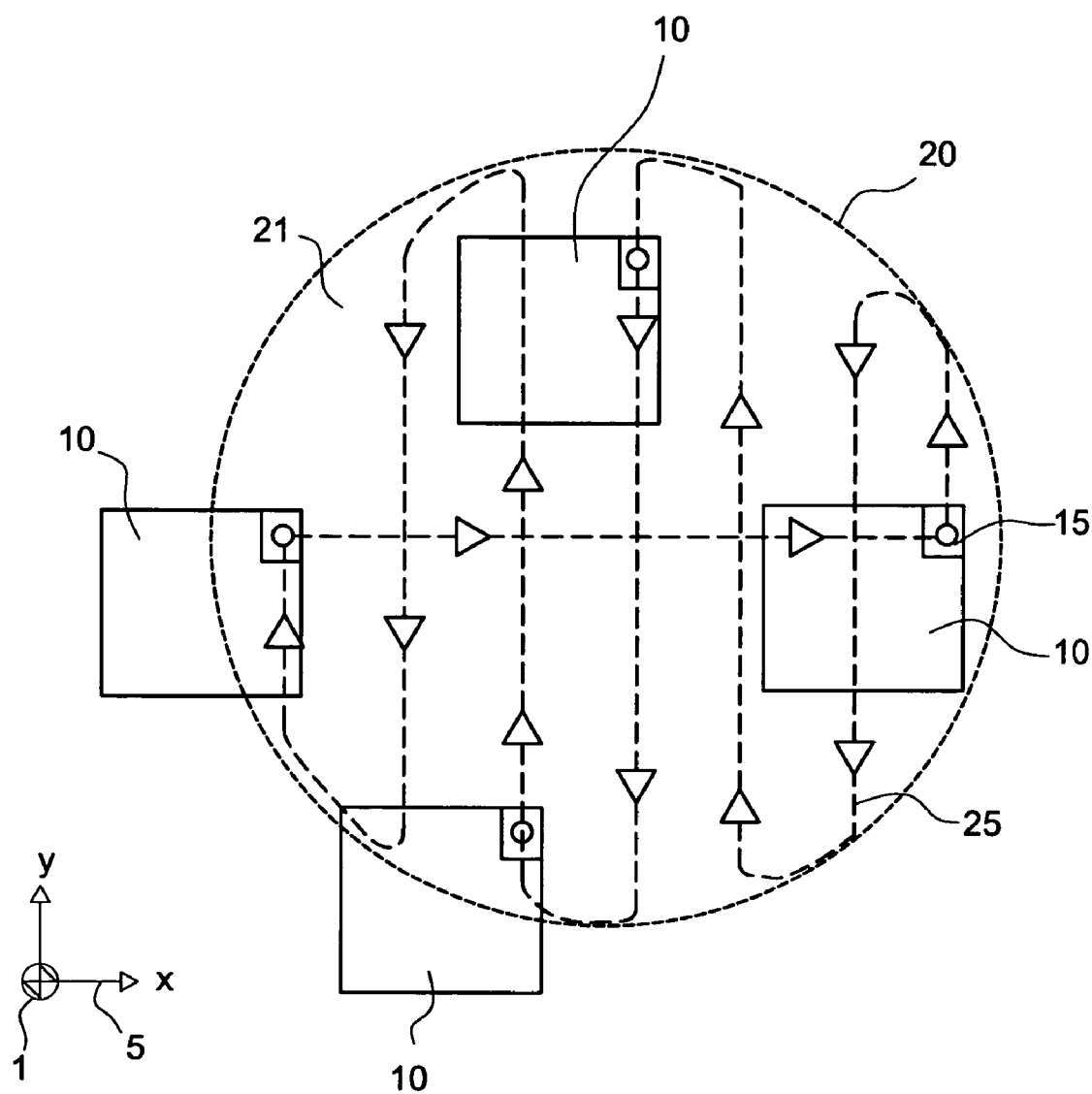
FIG. 2 shows schematically the first aspect of the invention.

FIG. 2 schematically illustrates the first embodiment of the present invention. In FIG. 2, a base 1 is shown, relative to which moveable object 10 moves in the x-y-plane that is indicated by coordinate system 5. The x-y plane is also indicated as the "plane of movement". The moveable object 10 follows a track in the x-y-plane. FIG. 2 illustrates this by showing the position of the moveable object 10 at four positions along the track.

The moveable object 10 comprises a reference part 15, which moves along with the moveable object 10. The track the reference part 15 of the moveable object 10 follows in the plane of movement is indicated by reference numeral 25. All movements of the reference part 15 are within area 21 of the plane of movement. Area 21 is bound by a closed contour 20.

Figure 3:
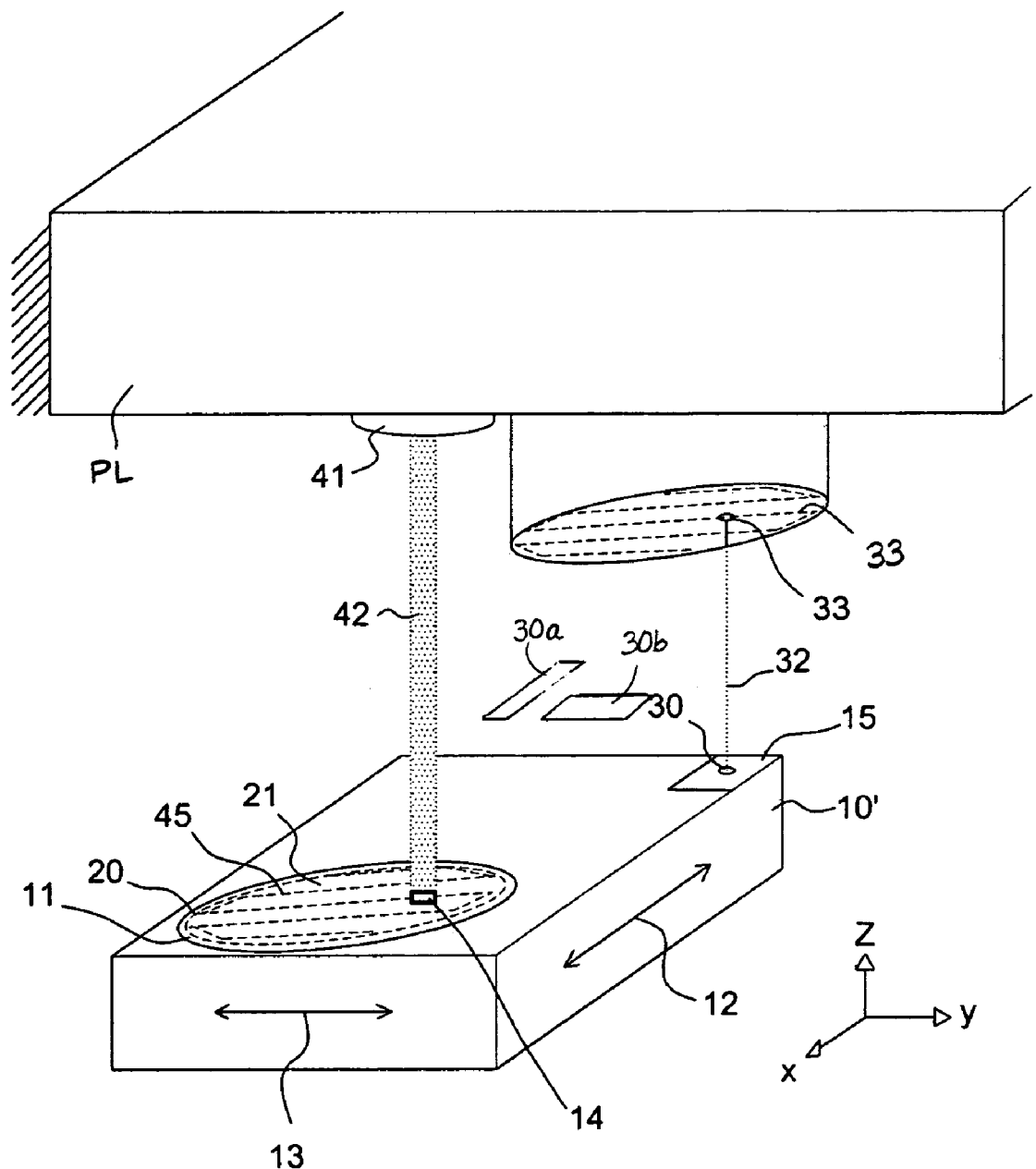
FIG. 3 shows schematically a first embodiment of the first aspect of the invention.

FIG. 3 schematically depicts a part of a lithographic apparatus associated with the first embodiment of the invention. In this case, moveable object 10 is a substrate table or holder 10'. The substrate table 10' holds wafer 11. The lithographic apparatus comprises a projection system 40 PL, which comprises lens 41. The projection system PL is adapted to project a patterned projection beam 42 onto the wafer 11. In the embodiment shown, the projected beam only irradiates a part 14 of the wafer surface that has to be irradiated. In order to irradiate the entire surface of the wafer 11, the substrate table 10' moves relative to the projection system PL in a plane of movement that is substantially parallel to the plane of the wafer 11.

In the embodiment shown, the plane of movement is the x-y-plane. The directions of movement of the substrate table 10' relative to the projection system PL are indicated by arrows 12, 13. In the embodiment of FIG. 3, the measurement system is adapted to measure displacement of the substrate table 10' relative to the projection system PL. As such, for the embodiment of FIG. 3, the moveable object 10 is the substrate table 10' and the base 1 is the projection system PL.

The substrate table 10' comprises a reference pan 15. Onto the reference part 15, a sensor head 30 is mounted. This sensor head 30 is adapted to cooperate with a planar element 35 for measuring displacement of the substrate table 10' relative to the projection system PL. It is, however, envisaged that the sensor head 30 is mounted onto the projection system PL and the planar element 35 is mounted onto the reference element. The displacement measured can be in a direction indicated by arrow 12 or 13, in the directions indicated by both arrows 12 and 13, or in a direction perpendicular the plane of movement. If displacement is measured in both directions indicated by arrows 12 and 13, generally two sensor heads 30a, 30b will be mounted onto reference part 15.

If the direction in which displacement of the substrate table 10' is measured (hereafter referred to as "the first direction of measurement") lies within a plane that is at least substantially parallel to the plane of movement, the sensor head 30 is preferably an encoder head, cooperating with a grating as a planar element 35. The grating can be arranged on a ruler. Also, the grating can be integrated with the projections system PL such as, for example, being printed onto it. The grating may comprise a single set of mutually parallel lines for measuring displacements in a single direction. Alternatively, the grating may be adapted for measuring displacement in two different directions, for example, by means of a checkerboard pattern or a grid pattern on the grating.

If the first direction of measurement is at least substantially perpendicular to the plane of movement, the sensor head 30 can be, for example, an interferometer or a capacitive sensor. If the sensor head 30 is an interferometer, the planar element 35 is a mirror. If the sensor head 30 is a capacitive sensor, the planar element 35 is an electrically conductive element.

As can be seen in FIG. 3, the planar element 35 has a shape that is essentially identical to the shape of the closed contour 20. It is envisaged that the size of the planar element is not the same as the contour size, as the required size will depend, for example, on the ratio between the size of the area irradiated by the projection beam 42 and the size of the area irradiated by measurement beam 32.

In the embodiment of FIG. 3, the sensor head 30 is an encoder, that is adapted to send measurement beam 32 to the planar element 35, which is configured as a grating. Due to the movements of the substrate table 10' relative to the projection system PL, the irradiated area 14 on the wafer 11 follows a track 45 over the wafer 11. While the measurement system is active, the measurement beam 32 sent by the sensor head 30 to the planar element 35 creates a touch point 33 on the planar element 35.

Because the planar element 35 is mounted onto the projection system PL, and the sensor head 30 is mounted onto the reference part 15 of the substrate table 10', the touch point 33 follows a track 25 over the planar element 35 that is identical in shape to the track 45. By using a planar element 35 tat has the same shape as the closed contour 20, the face of the planar element 35 cooperating with the sensor head 30 is used efficiently as no parts of the planar element 35 remain unused.

Figure 4:
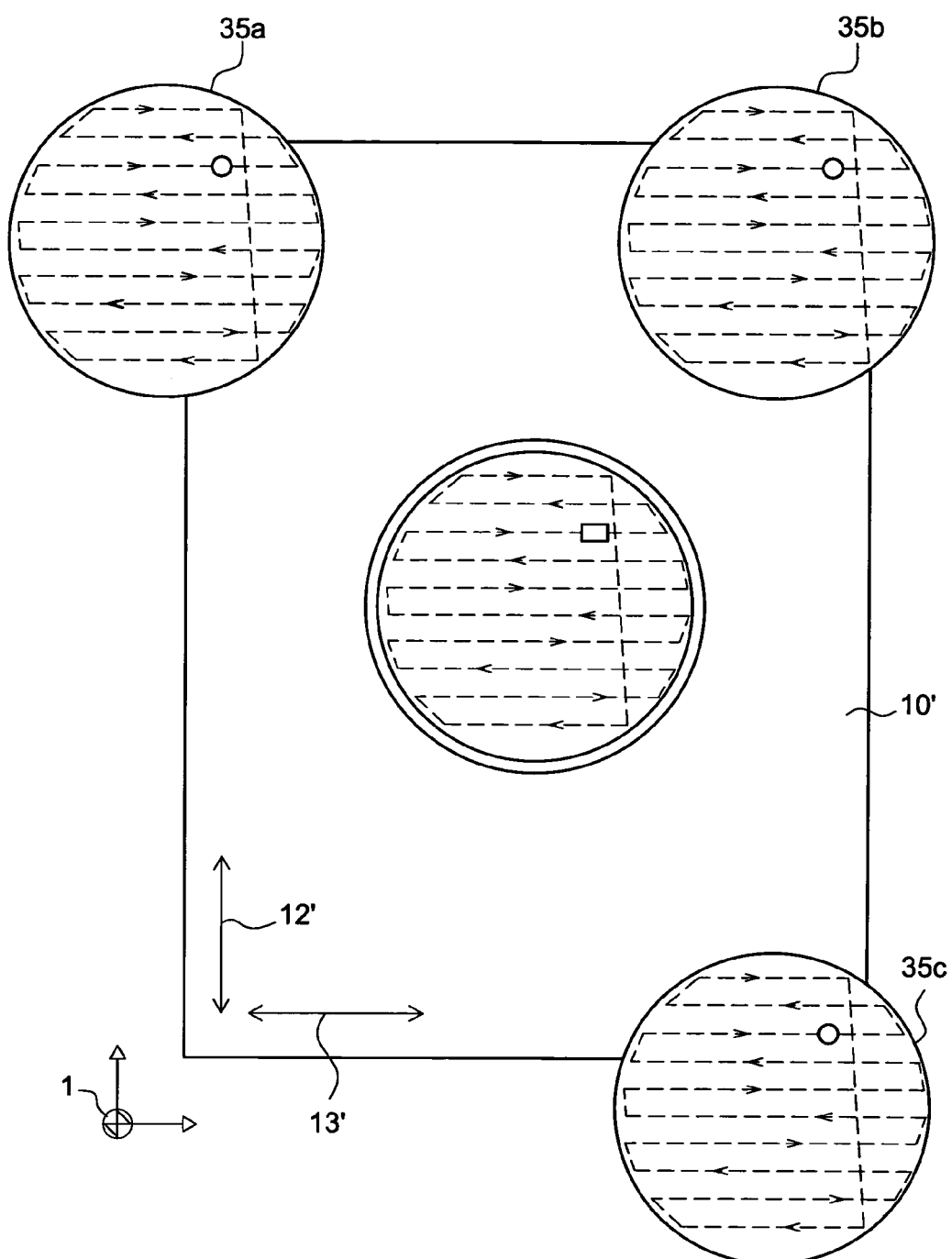
FIG. 4 shows schematically a second embodiment of the first aspect of the invention.

FIG. 4 shows a preferred embodiment of the first aspect of the invention. In this embodiment, the substrate table 10' is equipped with a first, second, and third reference part. The reference parts are located at known relative positions on the substrate table 10'.

On the first reference part, a first sensor head is mounted. The first sensor head cooperates with a first planar element 35a to measure the displacement of the first reference point relative to the base 1 in a first direction 12'. On the second reference part, a second sensor head is mounted. The second sensor head cooperates with a second planar element 35b to measure the displacement of the first reference point relative to the base 1, also in the first direction 12'.

On the third reference part, a third sensor head is mounted. The third sensor head cooperates with a third planar element 35c to measure the displacement of the first reference point relative to the base 1 in the second direction 13'. The sensor heads are located at known relative positions on the substrate table 10'.

Preferably, the first direction 12' and the second direction 13' lie within the plane of movement, and the second direction 13' is different from the first direction 12'. Moreover, the second direction 13' is perpendicular to the first direction 12'. In this manner, the displacement of the substrate table 10' relative to the base 1 (which is in this case the projection system) can be measured in the first direction 12' and in the second direction 13'. In addition, the rotational displacement of the substrate table 10' around an axis perpendicular to the plane of movement can be determined.

In an alternative embodiment, the measurement system comprises a first, a second, and a third sensor head, but only two planar elements 35a, b. The sensor heads are encoder heads, and the planar elements 35a,b are gratings. Only two reference parts are present, on one of which two sensor heads 30s are mounted. The first grating is provided with a checkerboard pattern or a grid pattern that enables measurement of displacement of the substrate table 10' relative to the base 1 in two different directions 12',13'. The second grating is provided with a single set of mutually parallel lines. The second grating is configured to measure the displacement of the substrate table 10' relative to the base 1 in a direction equal to one of the directions 12', 13' the first grating is used for.

Alternatively, it is envisaged that the second grating is, like the first grating, adapted for two-dimensional measurements. In that case, a fourth sensor head is provided for cooperating with the second planar element 35b. The fourth sensor head is mounted onto the second reference part together with the third sensor head. By measuring both directions 12', 13' twice, additional accuracy is obtained.

It is also envisaged that in the embodiment of FIG. 4, the first direction of measurement and the second direction of measurement are equal, and perpendicular to the plane of movement of the substrate table 10'. This way, displacement of the substrate table 10' relative to the base 1 in the direction perpendicular to the plane of movement can be determined, as well as rotational displacement of the substrate table 10' around axes in the plane of movement.

In FIGS. 2–4, the moveable object 10 shown is a substrate table. However, the first aspect of the invention can be applied to various kinds of moveable objects, including the reticle stage.

Figure 5:
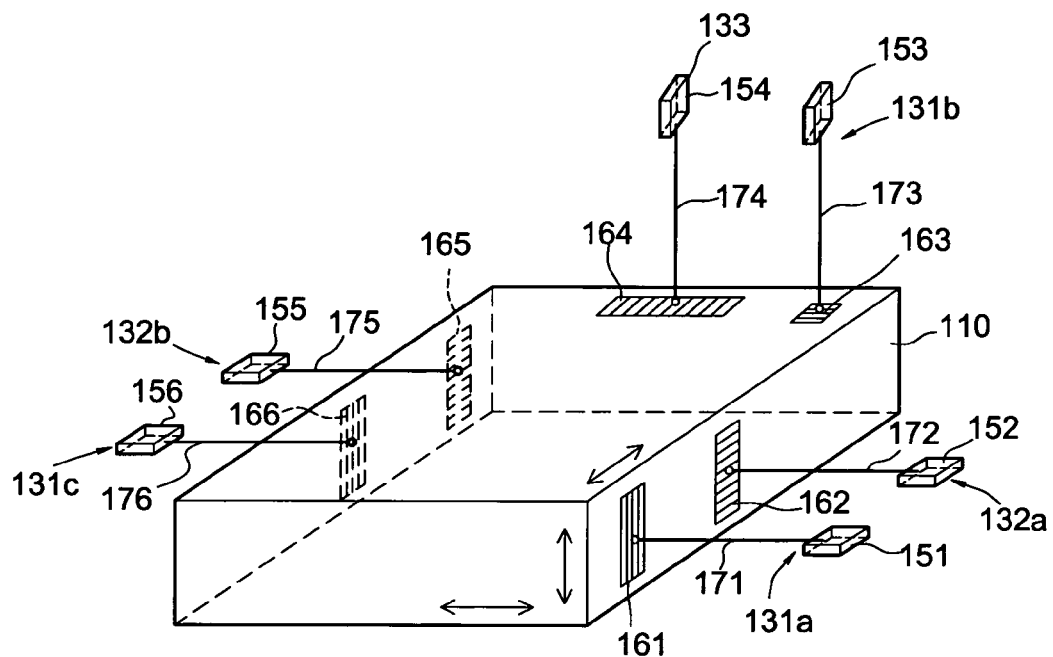
FIG. 5 shows schematically a first embodiment of the second aspect of the invention.
Figure 5:
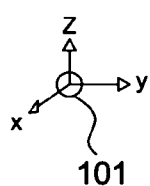

FIG. 5 shows a first embodiment of a relevant part of a lithographic apparatus in accordance with the second aspect of the invention.

Moveable object 110 is part of the lithographic apparatus and is moveable relative to base 101 in six degrees of freedom. The lithographic apparatus comprises a measurement system for measuring displacement of the moveable object 110 relative to the base 101 in six degrees of freedom. The second aspect of the invention can be applied for various combinations of moveable objects and bases. In an advantageous embodiment, the moveable object 110 is a reticle stage, and the base 101 is the projection system. However, it is also possible that the moveable object 110 is a substrate table, the base 101 again being the projection system. It is also envisaged that the measurement system is used for measuring displacement of the short stroke unit of the reticle stage relative to the long stroke unit of a single reticle stage.

In the embodiment of FIG. 5, the measurement system comprises six measurement units. Each measurement unit comprises a sensor head 151, 152, 153, 154, 155, 156 and a planar element 161, 162, 163, 164, 165, 166. The sensor head 151, 152, 153, 154, 155, 156 is configured to send a measurement beam to the associated planar element 161, 162, 163, 164, 165, 166, and the associated planar element 161, 162, 163, 164, 165, 166 is configured to reflect the measurement beam 171, 172, 173, 174, 175, 176 to the sensor head 151, 152, 153, 154, 155, 156 to measure translational displacement of the sensor head 151, 152, 153, 154, 155, 156 relative to the planar element 161, 162,163, 164, 165, 166.

In the embodiment of FIG. 5, the sensor heads are encoder heads, and the planar elements comprise gratings. In FIG. 5, the sensor heads 151, 152, 153, 154, 155, 156 are mounted on base 101, and the planar elements 161, 162, 163, 164, 165, 166 are mounted on the moveable object 110. This can, however, also be the other way around, that is: the sensor heads 151, 152, 153, 154, 155, 156 being mounted onto the moveable object 110 and the planar elements 161, 162, 163, 164, 165, 166 being mounted onto the base 101.

Three of the measurement units 131abc, 132ab, 133 are primary measurement units 131abc, which measure the translational displacement of the moveable object 110 relative to the base 101 in a first direction. They measure displacement of the moveable object 110 relative to the base 101 in x-direction.

Two of the measurement units 131abc, 132ab, 133 are secondary measurement units 132ab, which measure the translational displacement of the moveable object 110 relative to the base 101 in a second direction. They measure displacement of the moveable object 110 relative to the base 101 in z-direction.

One of the measurement units 131abc, 132ab, 133 is the tertiary measurement unit 133, which measures the translational displacement of the moveable object 110 relative to the base 101 in a third direction. It measures displacement of the moveable object 110 relative to the base 101 in y-direction.

Preferably, each of the x-, y- and z-directions is perpendicular to the other two directions.

All measurement units 131abc, 132ab, 133 are located at known relative positions. This way, rotations of the moveable object 110 axes extending in x-, y- and z-direction can be determined based on the measurements of performed by the measurement units 131abc, 132ab, 133.

In accordance with the second aspect of the invention, the measurement units 131abc, 132ab, 133 are combined into three measurement assemblies. Each of these three measurement assemblies comprises a primary measurement unit 131abc and either a secondary measurement unit 132ab or a third measurement unit 133. In the embodiment shown in FIG. 5, the first measurement assembly comprises measurement units 131a and 132a. The second measurement assembly comprises measurement units 131b and 133. The third measurement assembly comprises measurement units 131c and 132b.

Measurement unit 131a measures the translational displacement of the moveable object 110 relative to the base 101 in the x-direction. Measurement unit 132a measures the translational displacement of the moveable object 110 relative to the base 101 in the z-direction. Therefore, the measurement plane associated with the first measurement assembly is the x-z-plane. In accordance with the second aspect of the invention, the planar elements 161, 162 of the first measurement assembly are parallel to the measurement plane.

Measurement unit 131b measures the translational displacement of the moveable object 110 relative to the base 101 in the x-direction. Measurement unit 133 measures translational displacement of the moveable object 110 relative to the base 101 in the y-direction. Therefore, the measurement plane associated with the second measurement assembly is the x-y-plane. In accordance with the second aspect of the invention, the planar elements 163, 164 of the second measurement assembly are parallel to the measurement plane.

Measurement unit 131c measures the translational displacement of the moveable object 110 relative to the base 101 in the x-direction. Measurement unit 132b measures translational displacement of the moveable object 110 relative to the base 101 in the z-direction. Therefore, the measurement plane associated with the third measurement assembly is the x-z-plane. In accordance with the second aspect of the invention, the planar elements 165, 166 of the third measurement assembly are parallel to the measurement plane.

The measurement system according to the second aspect of the invention thus eliminates the necessity for using capacitive sensors or interferometers for determining displacement of a moveable object 110 relative to a base 101.

Figure 6:
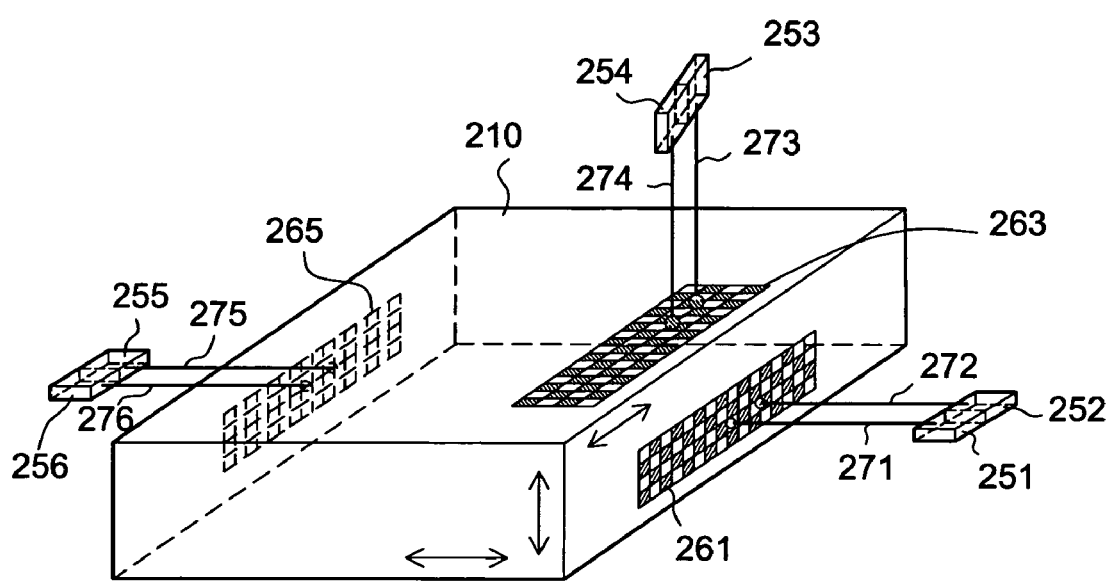
FIG. 6 shows schematically a second embodiment of the second aspect of the invention.
Figure 6:
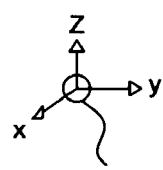

FIG. 6 shows a preferred embodiment of the second aspect of the invention. In this embodiment, the measurement units 131abc, 132ab, 133 of each measurement assembly are more or less integrated when compared to the embodiment of FIG. 5. In the embodiment of FIG. 5, each measurement assembly comprises two planar elements 161, 162,163,164,165,166, each comprising a grating, the lines of one grating extending in a direction different from the direction in which the lines of the other grating extend. In the embodiment of FIG. 6, the planar elements of each measurement assembly are combined into a single planar element 261, 263, 265 having a two dimensional grating. For allowing measurement in two directions, the planar elements 261, 263, 265 comprise a grid of lines or a checkerboard pattern.

In the embodiment of FIG. 6, sensor heads are indicated by reference numerals 251,252,253,254,255,256. Sensor heads that are part of the same measurement assembly use the same planar element. It is also possible that the sensor heads of a measurement assembly are both accommodated in a sensor head unit. As in the embodiment of FIG. 5, each sensor head 251,252,253,254,255,256 is configured to send a measurement beam 271,272,273,274,275,276 to the associated planar element, and the associated planar element is adapted to reflect the measurement beam to the sensor head to measure the translational displacement of the respective sensor head relative to the associated planar element.

In both embodiments of the second aspect of the invention, the pitch between the lines of the grating may vary over the grating. In case of a checkerboard pattern, the size and shape of the light and dark areas may vary. In order to reduce measurement errors due to such variations, the measurement system preferably comprises means for determining the average pitch between a plurality of lines or transitions between light and dark of the grating concerned.

As an alternative or in addition to this provision, the lines or areas of the grating may be mapped by means of calibration before use. The map of the lines or the areas is subsequently stored in the measurement system.

In the lithographic apparatus, the displacement of the moveable object 210 in a first translational degree of freedom is significantly larger than the displacement of that moveable object 210 in the other translational degrees of freedom. This is, for example, the case with the movements of the reticle stage relative to the projection system. The displacements of the reticle stage in its y-direction are far larger than displacements in other directions. In such situations, the direction of measurement associated with the primary measurement units is substantially equal to the direction of the first translational degree of freedom. This increases the accuracy of the measurements.

Figure 7:
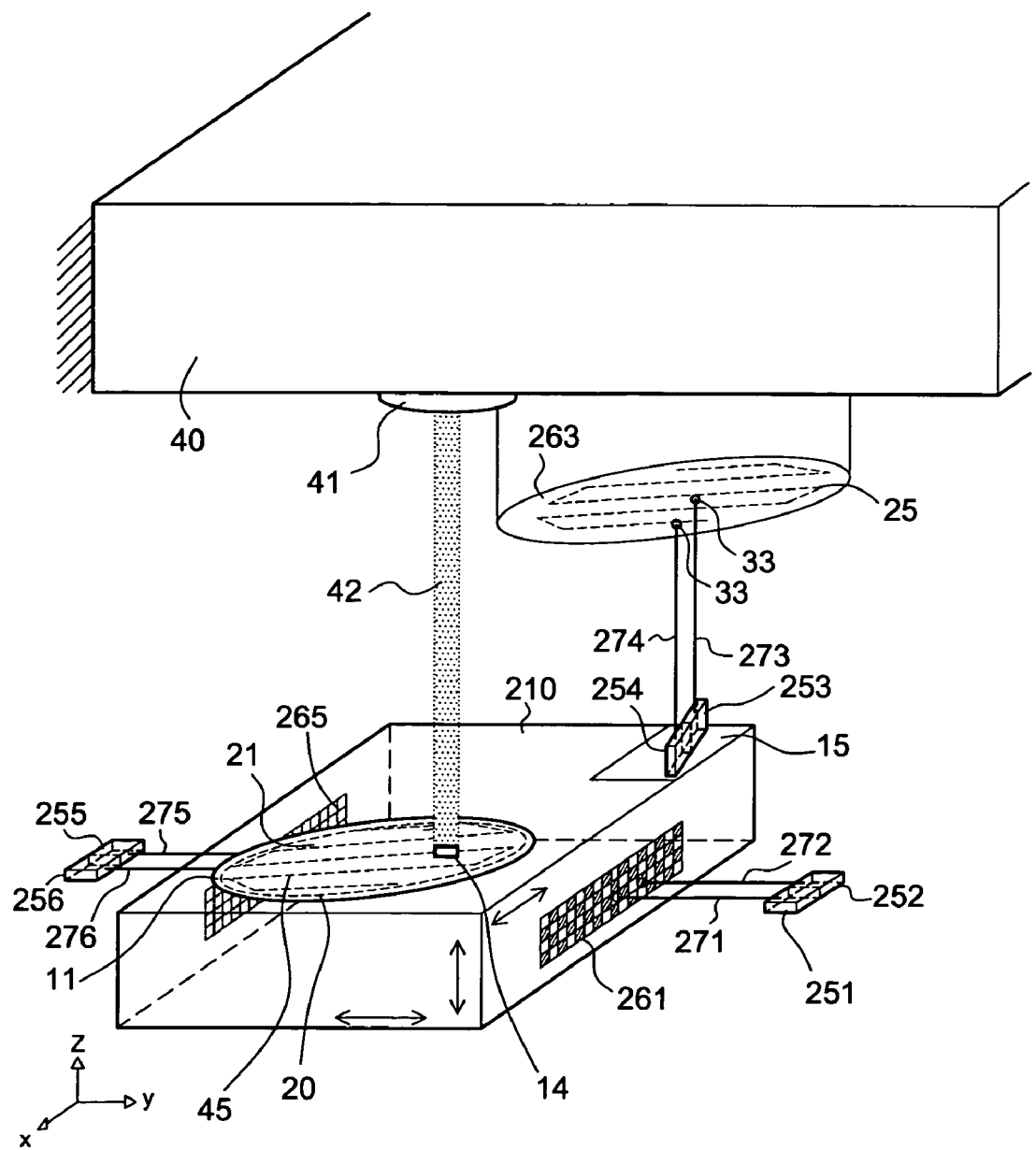
FIG. 7 shows schematically an embodiment of a combination of the first aspect and the second aspect of the invention.

It is envisaged to combine the first aspect of the invention and the second aspect of the invention. This is shown in FIG. 7. In FIG. 7, the moveable object 210 has one reference part. Onto this reference part, sensor heads 253 and 254 are mounted. The reference part is moveable in the x-y plane relative to the base 201 along with the moveable object 210. In the embodiment of FIG. 7, the base 201 is the projection system. The actual movements of the reference part are within an area of said plane of movement, and that area is bound by a closed contour. A planar element of at least one measurement assembly has a measurement plane that is substantially parallel to the plane of movement has a shape that is essentially identical to the shape of the contour. In the embodiment of FIG. 7, the planar element is a two-dimension grating. This embodiment combines the advantages of the first and the second aspect of the invention.

Such a measurement system would be suitable for measuring displacement of the substrate table relative to the projection system, as the substrate table make large movements in both the x- and the y-direction during the irradiation of the wafer.

As in the embodiment of FIG. 7, two touch points 33 are present, the planar element 263 is larger than area 21 of the wafer 11.

Figure 8:
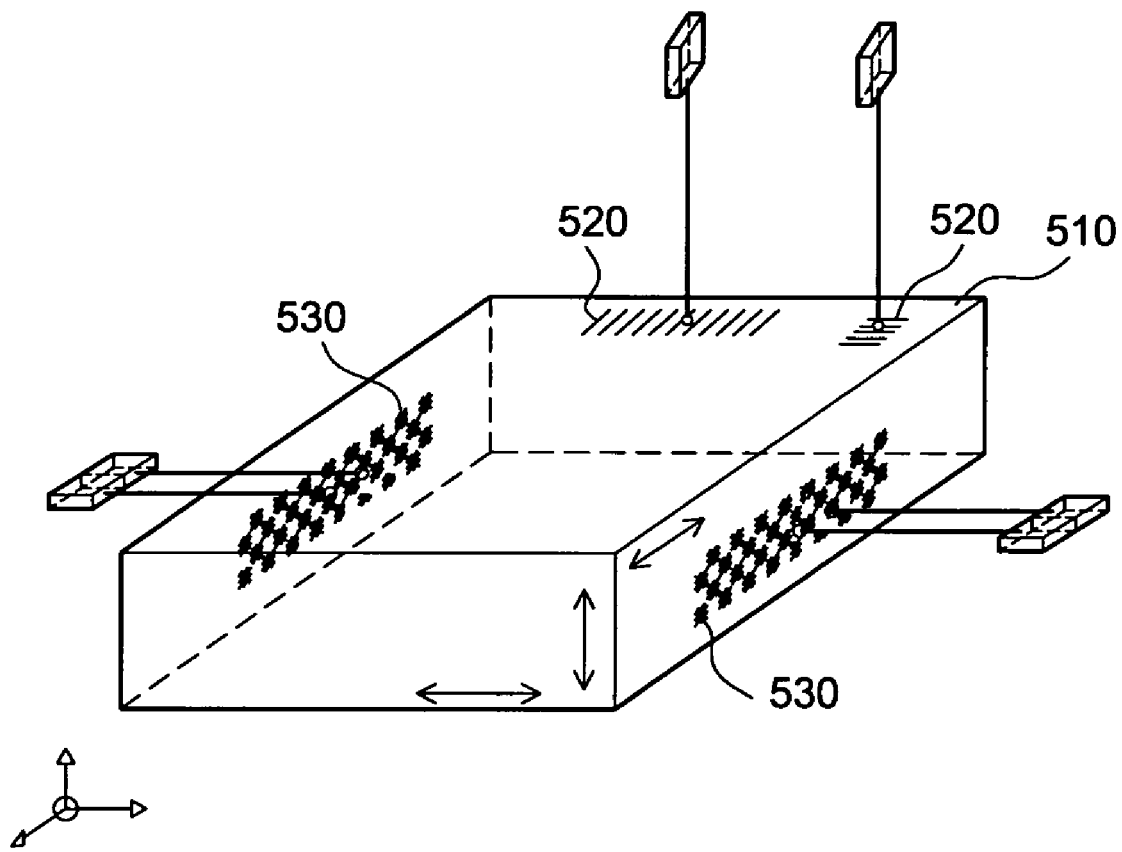
FIG. 8 shows schematically an embodiment of the third aspect of the invention.

The third aspect of the invention proposes to make the grating an integral part of the movable object. This is shown in FIG. 8.

Preferably, the moveable object 510 comprises lines 520 or areas 530 of a grating. These lines 520 or areas 530 preferably are printed directly onto the moveable object 510. Instead of printing, the lines or the areas of the grating can be applied to the movable object by means of vapor deposition. Alternatively, it is envisaged that the lines or the areas of the grating are etched into the moveable object.

While specific embodiments of the invention have been described above, it will be appreciated that the invention may be practiced otherwise than as described. The description is not intended to limit the invention.

What is claimed is:

1. A measurement system for measuring the displacement of a moveable object relative to a base along at least a first direction of measurement, said movable object having at least one reference part that is moveable in a plane of movement relative to said base in which the actual movement of said reference part is limited to within an area bounded by a closed substantially curved contour, said measurement system comprising:
    a planar element having a shape that is substantially similar to the closed substantially curved contour shape of said bounded area; and
    a sensor head configured to operatively cooperate with said planar element to determine displacement of said movable object,
    wherein said planar element and said sensor head are arranged so that said sensor head is mounted to said reference part of said moveable object or said planar element is mounted to said base and said sensor head is mounted to said reference part of said moveable object.

2. A lithographic apparatus, comprising:
    an illumination system for providing a beam of radiation;
    a support structure for supporting a patterning device that imparts said beam radiation with a pattern in its cross-section;
    a substrate holder for holding a substrate having a target portion;
    a projection system for projecting said patterned beam onto said target portion of said substrate;
    a moveable object having at least one reference part that is moveable in a plane of movement relative to a base in which the actual movement of said reference part is limited to within an area bounded by a closed substantially curved contour; and
    a measurement system for measuring displacement of said moveable object relative to a base along at least a first direction of measurement, said measurement system comprising:
    a planar element having a shape that is substantially similar to the closed substantially curved contour shape of said bounded area;
    a sensor head configured to operatively cooperate with said planar element to determine displacement of said movable object, and
    wherein said planar element and said sensor head are arranged so that said sensor head is mounted to said reference part of said moveable object or said planar element is mounted to said base and said sensor head is mounted to said reference part of said moveable object.

3. The lithographic apparatus of claim 2, wherein the first direction of measurement lies within a plane that is at least substantially parallel to the plane of movement.

4. The lithographic apparatus of claim 2, wherein the first direction of measurement is at least substantially perpendicular to the plane of movement.

5. The lithographic apparatus of claim 3, wherein said sensor head is an encoder head and said planar element is a ruler comprising a grating.

6. The lithographic apparatus of claim 4, wherein said sensor head is an interferometer and said planar element is a mirror.

7. The lithographic apparatus of claim 4, wherein said sensor head is capacitive sensor and said planar element is an electrically conductive element.

8. The lithographic apparatus of claim 2, wherein said movable object is a reticle stage.

9. The lithographic apparatus of claim 2, wherein said movable object is said substrate holder.

10. A device manufacturing method comprising:
    providing a substrate having a target portion;
    providing a beam of radiation;
    imparting said beam of radiation with a desired pattern in its cross-section;
    projecting the patterned beam of radiation onto the target portion of the substrate,
    measuring the displacement of a moveable object relative to a base along at least a first direction of measurement, said movable object having at least one reference part that is moveable in a plane of movement relative to said base in which the actual movement of said reference part is limited to within an area bounded by a closed substantially curved contour;
    measuring displacement of the moveable object relative to a base along at least a first direction of measurement by employing a measurement system,
    wherein said measurement system comprises a sensor head and a planar element associated with said sensor head, the sensor head being mounted onto the base and the planar element being mounted onto the reference part of the moveable object or the planar element being mounted onto the base and the sensor bead being mounted onto the reference part of the moveable object;
    wherein the planar element has a shape that is substantially similar to the shape of the substantially curved closed contour.

* * * * *